(12) United States Patent
Uota et al.

(10) Patent No.: US 10,338,128 B2
(45) Date of Patent: Jul. 2, 2019

(54) LIFE ESTIMATION CIRCUIT AND SEMICONDUCTOR DEVICE MADE USING THE SAME

(71) Applicant: Mitsubishi Electric Corporation, Tokyo (JP)

(72) Inventors: Shiori Uota, Tokyo (JP); Fumitaka Tametani, Tokyo (JP); Takahiro Inoue, Tokyo (JP); Rei Yoneyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 69 days.

(21) Appl. No.: 15/180,383

(22) Filed: Jun. 13, 2016

(65) Prior Publication Data

US 2017/0074921 A1 Mar. 16, 2017

(30) Foreign Application Priority Data

Sep. 14, 2015 (JP) .................................. 2015-180744

(51) Int. Cl.
*G01R 31/26* (2014.01)
*H01L 27/06* (2006.01)
(Continued)

(52) U.S. Cl.
CPC ......... *G01R 31/2642* (2013.01); *G01R 31/42* (2013.01); *H01L 27/0635* (2013.01);
(Continued)

(58) Field of Classification Search
None
See application file for complete search history.

(56) References Cited

U.S. PATENT DOCUMENTS

| 5,897,597 A * | 4/1999 | O'Daniel | G01M 3/025 |
| | | | 123/574 |
| 2002/0193970 A1* | 12/2002 | Singh | G05B 15/02 |
| | | | 702/188 |

(Continued)

FOREIGN PATENT DOCUMENTS

| CN | 103268135 A | 8/2013 |
| JP | H08-126337 A | 5/1996 |

(Continued)

OTHER PUBLICATIONS

An Office Action dated by German Patent Office on Jan. 19, 2018, which corresponds to German Patent Application 10 2016 214 223.2 and is related to U.S. Appl. No. 15/180,383; with English language translation.

(Continued)

*Primary Examiner* — Paresh H Patel
(74) *Attorney, Agent, or Firm* — Studebaker & Brackett PC (57) ABSTRACT

A life estimation circuit includes a temperature detector configured to detect temperature of a power element unit, an inflection point detection unit configured to detect an inflection point of temperature variation in the power element unit based on an output signal from the temperature detector, an operation unit configured to determine an absolute value of a difference between the temperature of the power element unit at an inflection point detected this time and the temperature of the power element unit at an inflection point detected last time, a count circuit configured to count the number of times that the absolute value of the difference in temperature has reached a threshold temperature, and a signal generation unit configured to output, when a count value from the count circuit reaches a threshold number of (Continued)

times, an alarm signal indicating that the power element is about to reach the end of its life.

16 Claims, 7 Drawing Sheets

(51) Int. Cl.
    *H01L 29/16*     (2006.01)
    *H01L 29/739*     (2006.01)
    *H01L 29/861*     (2006.01)
    *G01R 31/42*     (2006.01)
    *H03K 17/18*     (2006.01)

(52) U.S. Cl.
    CPC .......... *H01L 29/16* (2013.01); *H01L 29/1608* (2013.01); *H01L 29/7393* (2013.01); *H01L 29/861* (2013.01); *G01R 31/2608* (2013.01); *G01R 31/2632* (2013.01); *H03K 17/18* (2013.01)

(56) References Cited

U.S. PATENT DOCUMENTS

| | | | |
|---|---|---|---|
| 2003/0052401 A1 | 3/2003 | Mori et al. | |
| 2007/0278098 A1* | 12/2007 | Yokosawa | G01N 27/4141 204/431 |
| 2008/0208513 A1* | 8/2008 | Dupuy | H01L 23/34 702/132 |
| 2009/0091979 A1* | 4/2009 | Shalvi | G11C 11/56 365/185.09 |
| 2010/0125435 A1 | 5/2010 | Pong et al. | |
| 2013/0016934 A1* | 1/2013 | Garnier | F16C 9/00 384/291 |
| 2013/0169347 A1* | 7/2013 | Kim | G06F 1/206 327/513 |
| 2013/0214748 A1 | 8/2013 | Uota et al. | |
| 2014/0233708 A1 | 8/2014 | Ishiyama et al. | |
| 2014/0265976 A1 | 9/2014 | Weiss et al. | |
| 2016/0155278 A1 | 6/2016 | Nozawa et al. | |

FOREIGN PATENT DOCUMENTS

| | | | |
|---|---|---|---|
| JP | 2002-101668 A | | 4/2002 |
| JP | 2013-168905 A | | 8/2013 |
| JP | 2014-011904 A | | 1/2014 |
| JP | 2014-056668 A | | 3/2014 |
| JP | 2015-056415 A | | 3/2015 |
| JP | 2015056415 A | * | 3/2015 |
| JP | 2016-111734 A | | 6/2016 |

OTHER PUBLICATIONS

An Office Action; "Notification of Reasons for Refusal," issued by the Japanese Patent Office on Aug. 7, 2018, which corresponds to Japanese Patent Application No. 2015-180744 and is related to U.S. Appl. No. 15/180,383; with English language translation.

An Office Action issued by the Chinese Patent Office on Mar. 15, 2019, which corresponds to Chinese Patent Application No. 201610827463.4 and is related to U.S. Appl. No. 15/180,383; with English language translation.

* cited by examiner

LIFE ESTIMATION CIRCUIT AND SEMICONDUCTOR DEVICE MADE USING THE SAME

BACKGROUND OF THE INVENTION

Field of the Invention

The present invention relates to life estimation circuits and semiconductor devices made using the same, and particularly to a life estimation circuit to estimate the life of a power element and a semiconductor device made using the same.

Description of the Background Art

A power element is subject to repeated, wide temperature variations as a current passing therethrough increases or decreases. As a result of the temperature variations, bonding of wires connecting the power element to electrodes gradually deteriorates and ultimately breaks, causing the power element to reach the end of its life. The wide temperature variations exert stress on solder connecting the components, causing the development of cracking and peeling which will lower the heat dissipation characteristics of the power element, sometimes even resulting in thermal destruction.

However, since a power element is applied to a wide variety of products and used in many different environments, life estimation is extremely difficult. This is problematic because a power element reaches the end of its life while being used, causing an irregular stop of the user side system. If the user does not have the power element in stock, the system needs to be stopped until after a power element becomes available and replaces the one that reached the end of its life, causing a significant loss to the user.

On the other hand, even when the power element is operating normally, some users replace the power element with a new one when the duration of use reaches a predetermined amount of time, so as to avoid abnormalities or failures of the system. In this case, the power element that has not reached the end of its life is discarded, thus increasing the cost of the user side system.

To address this problem, Japanese Patent Laying-Open No. 2015-56415 (Patent Document 1) discloses a life estimation circuit to detect temperature of a power element, count the number of times that the temperature has exceeded a threshold temperature (for example, 50° C.), and when the count value reaches a threshold value, output an end-of-life alarm signal warning that the power element is about to reach the end of its life.

SUMMARY OF THE INVENTION

In Patent Document 1, when the temperature of the power element varies from 25° C. to 75° C. to 60° C. to 85° C., for example, the number of times that the temperature has exceeded the threshold temperature (for example, 50° C.) is only once. Thus, it is determined that the temperature variation related to life has occurred once.

Actually, however, a temperature variation of −15° C. occurs during the variation from 75° C. to 60° C., and a temperature variation of +25° C. occurs during the variation from 60° C. to 85° C., causing significant thermal stress to be applied to the power element. In Patent Document 1, therefore, the thermal stress applied to the power element is underestimated, resulting in inability to accurately estimate the life of the power element.

Therefore, a main object of the present invention is to provide a life estimation circuit capable of accurately estimate the life of a power element, and a semiconductor device made using the same.

A life estimation circuit according to the present invention is a life estimation circuit for estimating life of a power element, the life estimation circuit including a temperature detector configured to detect temperature of the power element, an inflection point detection unit configured to detect an inflection point of temperature variation in the power element based on a result of the detection by the temperature detector, an operation unit configured to determine an absolute value of a difference between the temperature of the power element at an inflection point detected this time by the inflection point detection unit and the temperature of the power element at an inflection point detected last time by the inflection point detection unit, a count circuit configured to count the number of times of occurrence of a first temperature variation in which the absolute value of the difference in temperature determined by the operation unit reaches a first threshold temperature, and a signal generation unit configured to output a signal related to the life of the power element based on a count value from the count circuit.

In the life estimation circuit according to the present invention, an inflection point of temperature variation in the power element is detected, an absolute value of a difference between the temperature of the power element at an inflection point detected this time and the temperature of the power element at an inflection point detected last time is determined, the number of times of occurrence of a first temperature variation in which the absolute value reaches a first threshold temperature is counted, and a signal related to the life of the power element is output based on the count value. Accordingly, thermal stress applied to the power element can be accurately detected, so that the life of the power element can be accurately estimated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
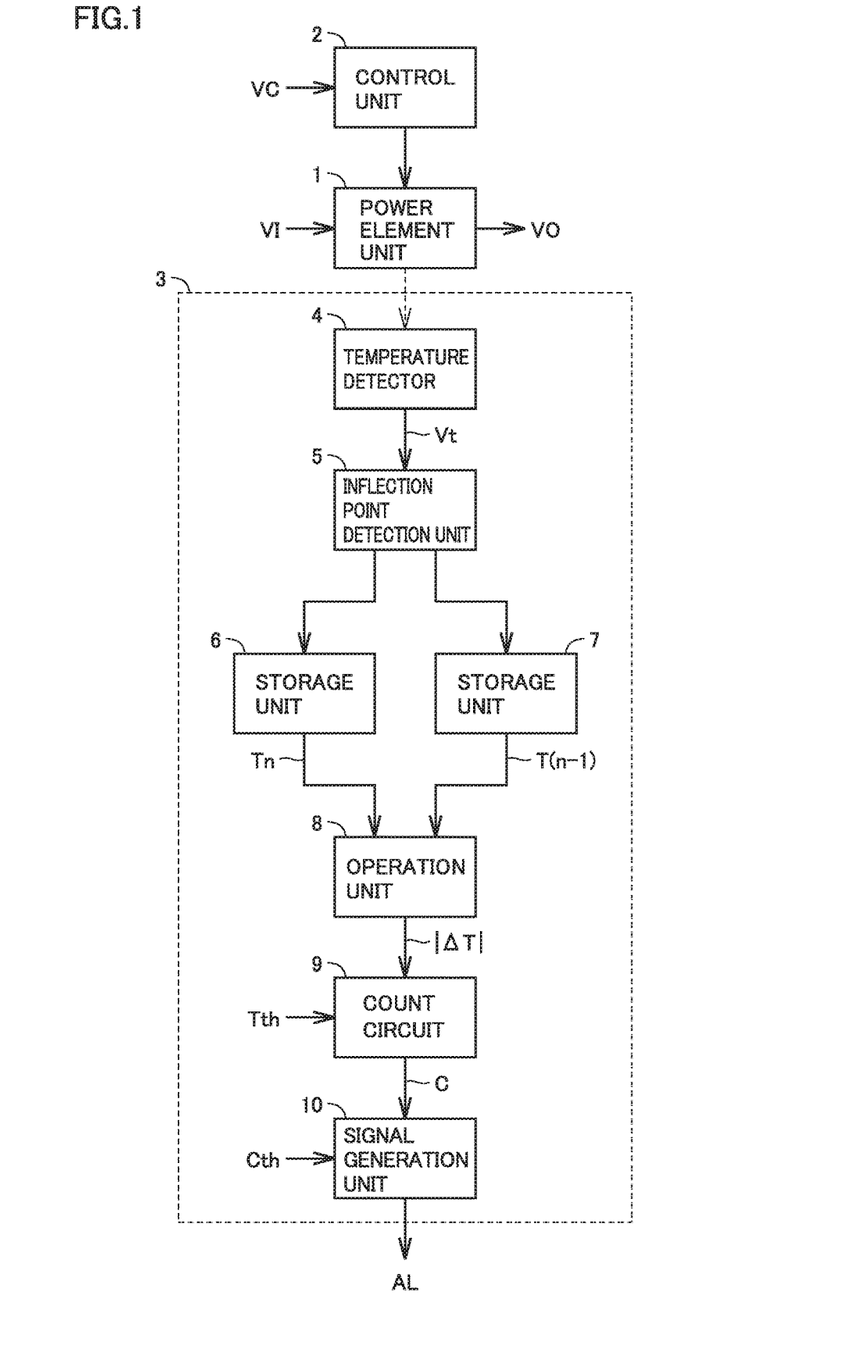
FIG. 1 is a block diagram showing the configuration of a power module according to a first embodiment of the present invention.

FIG. 1 is a block diagram showing the configuration of a power module according to a first embodiment of the present invention. In FIG. 1, this power module includes a power element unit 1, a control unit 2, and a life estimation circuit 3.

Power element unit 1 includes a plurality of power elements, is controlled by control unit 2, and converts a direct-current (DC) voltage VDC into an alternating-current (AC) voltage VAC, for example. The power elements are IGBTs (Insulated Gate Bipolar Transistors), MOSFETs, bipolar transistors, diodes or the like.

Control unit 2 coverts DC voltage VDC into sinusoidal AC voltage VAC by turning each of the plurality of power elements of power element unit 1 on/off based on, for example, a sinusoidally varying voltage command value VC. When a current is passed through the power element, loss (namely, heat) occurs in the power element, whereby the temperature of the power element increases. When the current flowing through the power element is interrupted, the temperature of the power element decreases.

Life estimation circuit 3 estimates the life of power element unit 1 based on the temperature variation in power element unit 1, and when life estimation circuit 3 determines that power element unit 1 is about to reach the end of its life, raises an alarm signal AL from a deactivated "L" level to an activated "H" level. Life estimation circuit 3 includes a temperature detector 4, an inflection point detection unit 5, storage units 6 and 7, an operation unit 8, a count circuit 9, and a signal generation unit 10.

Temperature detector 4 detects the temperature of power element unit 1, and outputs a signal Vt indicating the detected value. The level of signal Vt varies depending on the temperature of power element unit 1. Inflection point detection unit 5 detects an inflection point of the temperature variation in power element unit 1 based on output signal Vt from temperature detector 4. The inflection point of the temperature variation is a point at which the temperature reverses from increasing to decreasing, or reverses from decreasing to increasing.

Inflection point detection unit 5 samples output signal Vt from temperature detector 4 at intervals sufficiently shorter than the interval during which the power elements included in power element unit 1 are turned on/off, for example, and converts the level of sampled signal Vt into a digital signal. Inflection point detection unit 5 determines whether the levels of a plurality of sampled signals Vt are increasing or decreasing, and detects inflection points based on a result of the determination.

Whenever an inflection point is detected, inflection point detection unit 5 writes a digital signal indicating the level of signal Vt (namely, temperature T of power element unit 1) at that inflection point alternately into storage units 6 and 7. For example, a digital signal indicating a temperature Tn of power element unit 1 at an inflection point detected this time is written into storage unit 6, and a digital signal indicating a temperature $T(n-1)$ of power element unit 1 at an inflection point detected last time is written into storage unit 7. The digital signals indicating temperatures Tn and $T(n-1)$ and written into storage units 6 and 7 are provided to operation unit 8, where n is any integer.

Based on the digital signals from storage units 6 and 7, operation unit 8 determines an absolute value $|\Delta T|$ of a difference $\Delta T = T(n-1)$ between temperature Tn of power element unit 1 at the inflection point detected this time and temperature $T(n-1)$ of power element unit 1 at the inflection point detected last time. Operation unit 8 provides a digital signal indicating absolute value $|\Delta T|$ to count circuit 9.

Based on the digital signal indicating absolute value $|\Delta T|$ from operation unit 8, count circuit 9 counts the number of times that a predetermined temperature variation has occurred. For example, count circuit 9 compares $|\Delta T|$ with a threshold temperature Tth, and when $|\Delta T| \geq Tth$ is satisfied, determines that the predetermined temperature variation has occurred and increments (+1) a count value C, and when $|\Delta T| < Tth$ is satisfied, determines that the predetermined temperature variation has not occurred and maintains count value C without varying it.

Signal generation unit 10 compares count value C with a threshold number of times Cth, and when $C \geq Cth$ is satisfied, sets alarm signal AL warning that power element unit 1 is about to reach the end of its life to the activated "H" level, and when $C < Cth$ is satisfied, maintains alarm signal AL at the deactivated "L" level.

The operation of this power module is now described. For example, a load (for example, a motor) is to be driven by output voltage VAC from power element unit 1. When a current consumed by the load increases to increase the current flowing through power element unit 1, the temperature of power element unit 1 increases. When the current consumed by the load decreases to decrease the current flowing through power element unit 1, the temperature of power element unit 1 decreases. The temperature of power element unit 1 is detected by temperature detector 4, and output signal Vt from temperature detector 4 is provided to inflection point detection unit 5.

When the current consumed by the load reverses from increasing to decreasing, the temperature of power element unit 1 reverses from increasing to decreasing, causing an inflection point to occur in the temperature variation in power element unit 1 (namely, the level variation in output signal Vt from temperature detector 4). That inflection point $P(n-1)$ is detected by inflection point detection unit 5, and a digital signal indicating temperature $T(n-1)$ of power element unit 1 at that inflection point $P(n-1)$ is written into storage unit 7.

Then, when the current consumed by the load reverses from decreasing to increasing, the temperature of power element unit 1 reverses from decreasing to increasing, causing an inflection point to occur in the temperature variation in power element unit 1 (namely, the level variation in output signal Vt from temperature detector 4). That inflection point Pn is detected by inflection point detection unit 5, and a digital signal indicating temperature Tn of power element unit 1 at that inflection point Pn is written into storage unit 6.

Absolute value $|\Delta T|$ of difference $\Delta T = Tn - T(n-1)$ between temperature Tn of power element unit 1 at inflection point Pn detected this time and temperature $T(n-1)$ of power element unit 1 at inflection point $P(n-1)$ detected last time is determined by operation unit 8. $|\Delta T|$ is compared with threshold temperature Tth by count circuit 9, and when $|\Delta T| \geq Tth$ is satisfied, count value C is incremented (+1).

Count value C is compared with threshold number of times Cth by signal generation unit 10, and when $C \geq Cth$ is satisfied, alarm signal AL is raised to the activated "H" level to warn the user that power element unit 1 is about to reach the end of its life. The user detects that power element unit 1 is about to reach the end of its life in response to alarm signal AL being raised to "H" level, and stops the system with appropriate timing and replaces the power module with a new one.

In this first embodiment, the inflection point of the temperature variation in power element unit 1 is detected, and absolute value |ΔT| of difference ΔT=Tn−T(n−1) between temperature Tn of power element unit 1 at inflection point Pn detected this time and temperature T(n−1) of power element unit 1 at inflection point P(n−1) detected last time is determined. When absolute value |ΔT| reaches threshold temperature Tth, it is determined that the temperature variation has occurred and count value C is incremented, and when the count value reaches threshold number of times Cth, alarm signal AL is set to the activated level. Accordingly, thermal stress applied to power element unit 1 can be accurately detected, so that the life of power element unit 1 can be accurately estimated.

Second Embodiment

Figure 2:
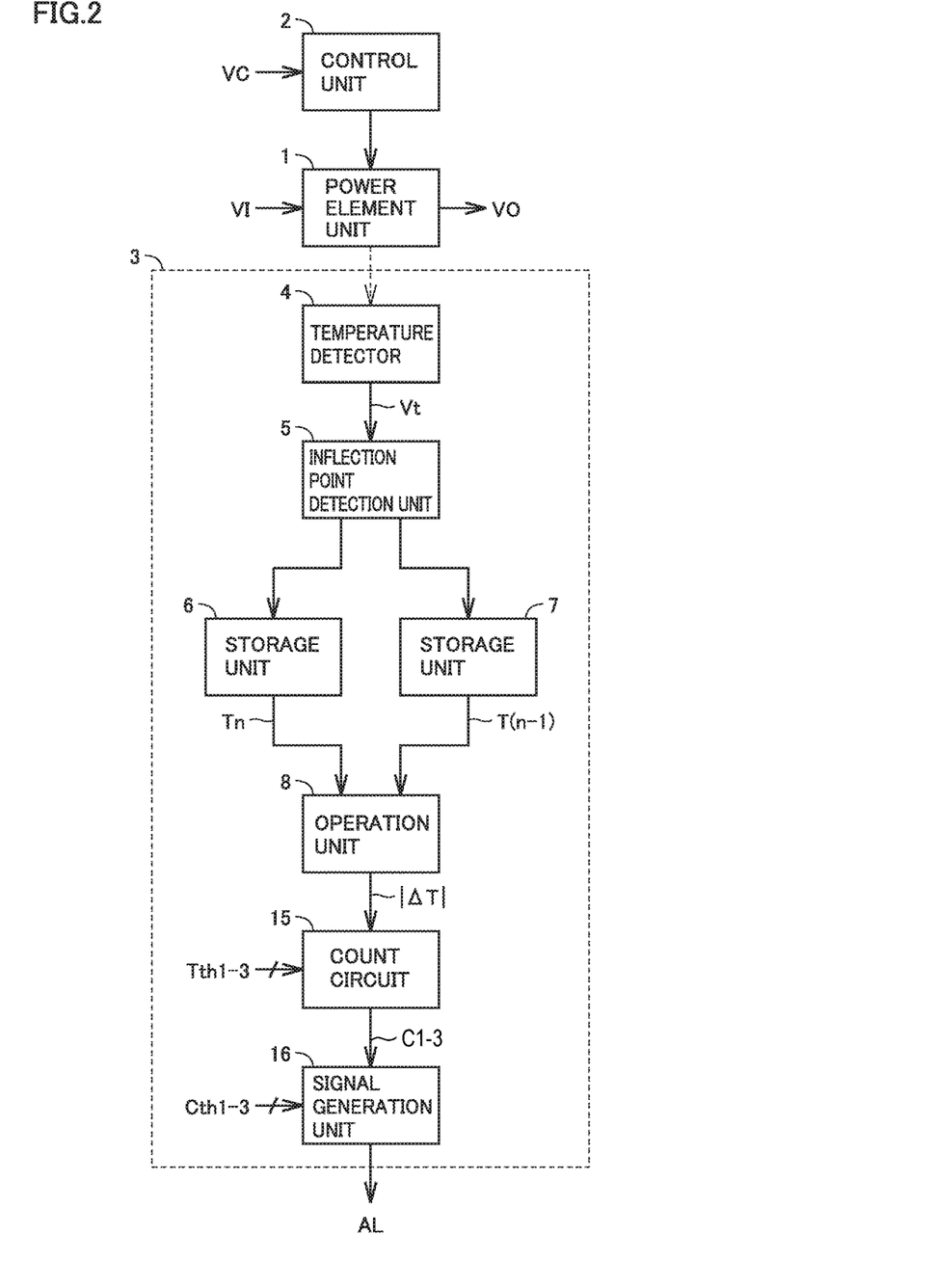
FIG. 2 is a block diagram showing the configuration of a power module according to a second embodiment of the present invention.

FIG. 2 is a block diagram showing the configuration of a power module according to a second embodiment of the present invention, which is compared with FIG. 1. With reference to FIG. 2, this power module is different from the power module shown in FIG. 1 in that count circuit 9 and signal generation unit 10 have been replaced with a count circuit 15 and a signal generation unit 16, respectively.

Count circuit 15 compares first to third threshold temperatures Tth1 to Tth3 with absolute value |ΔT| of the temperature difference determined by operation unit 8, and determines which one of first to third temperature variations ΔT1 to ΔT3 has occurred based on results of the comparisons. Tth1>Tth2>Tth3 holds. When Tth1<|ΔT| is satisfied, it is determined that first temperature variation ΔT1 has occurred. When Tth2<|ΔT|<Tth1 is satisfied, it is determined that second temperature variation ΔT2 has occurred. When Tth3<|ΔT|<Tth2 is satisfied, it is determined that third temperature variation ΔT3 has occurred.

Count circuit 15 increments (+1) a first count value C1 when first temperature variation ΔT1 has occurred, increments (+1) a second count value C2 when second temperature variation ΔT2 has occurred, and increments (+1) a third count value C3 when third temperature variation ΔT3 has occurred.

Signal generation unit 16 compares three threshold numbers of times Cth1 to Cth3 with count values C1 to C3 from count circuit 15, respectively. Cth1<Cth2<Cth3 holds. When any one of C1≥Cth1, C2≥Cth2, and C3≥Cth3 is satisfied, signal generation unit 16 sets alarm signal AL warning that power element unit 1 is about to reach the end of its life to the activated "H" level. When C1<Cth1, C2<Cth2, and C3<Cth3 are satisfied, signal generation unit 16 maintains alarm signal AL at the deactivated "L" level.

It is noted that Cth1 is set to the lowest value of three threshold numbers of times Cth1 to Cth3 because temperature stress by ΔT1 of three temperature variations ΔT1 to ΔT3 is the highest. Conversely, Cth3 is set to the highest value of three threshold numbers of times Cth1 to Cth3 because temperature stress by ΔT3 of three temperature variations ΔT1 to ΔT3 is the lowest.

Figure 3A:
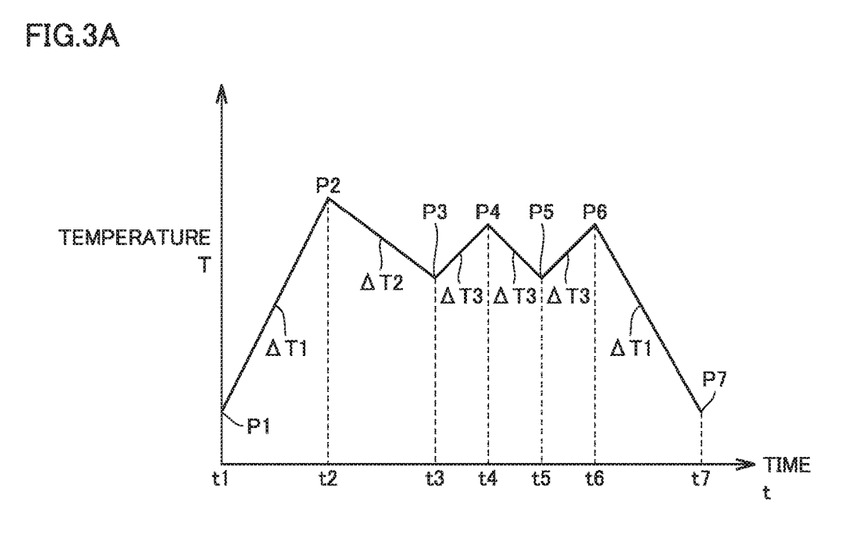
FIG. 3A is a time chart illustrating the operation of the power module shown in FIG. 2.
Figure 3B:
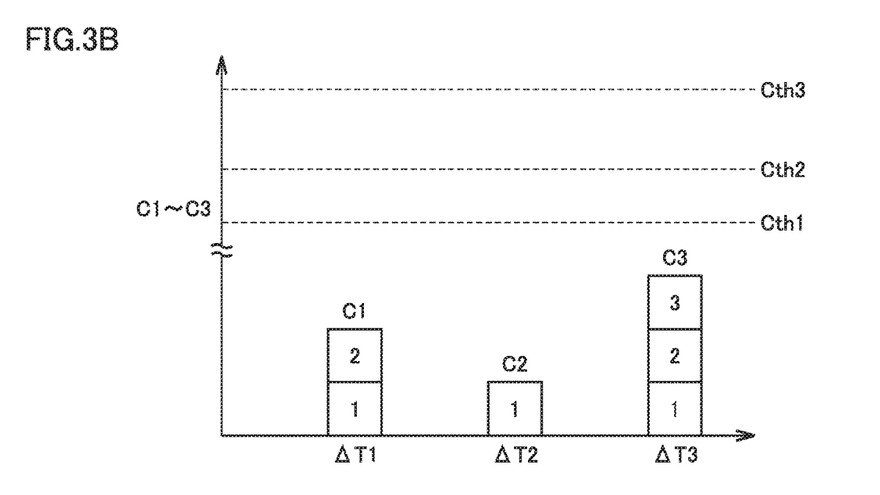
FIG. 3B is a time chart illustrating the operation of the power module shown in FIG. 2.

FIGS. 3A and 3B are diagrams schematically showing the operation of the power module shown in FIG. 2. Particularly, FIG. 3A shows temporal variation in temperature T of power element unit 1, while FIG. 3B shows count values C1 to C3 and threshold numbers of times Cth1 to Cth3 of first to third temperature variations ΔT1 to ΔT3.

Here, a load is to be driven by output voltage VAC from power element unit 1. In an initial state, power supply from power element unit 1 to the load is stopped, and temperature T of power element unit 1 is room temperature. At time t1, power supply from power element unit 1 to the load is started, whereby temperature T of power element unit 1 starts to increase. At a point when the operation of power element unit 1 is started (time t1), it is recognized that an inflection point P1 has occurred, and a digital signal indicating a temperature T1 of power element unit 1 at time t1 is written, for example, into storage unit 6.

When the current consumed by the load decreases and temperature T of power element unit 1 reverses from increasing to decreasing at time t2, an inflection point P2 is detected, and a digital signal indicating a temperature T2 of power element unit 1 at that inflection point P2 is written into storage unit 7. An absolute value |T2−T1| of the difference between temperature T2 of power element unit 1 at inflection point P2 detected this time and temperature T1 of power element unit 1 at inflection point P1 detected last time is determined by operation unit 8. Three threshold values Tth1 to Tth3 are compared with |T2−T1| by count circuit 15. Tth1<|T2−T1| is satisfied, and it is determined that first temperature variation ΔT1 has occurred between times t1 and t2, and first count value C1 is incremented.

When the current consumed by the load increases and temperature T of power element unit 1 reverses from decreasing to increasing at time t3, an inflection point P3 is detected, and a digital signal indicating a temperature T3 of power element unit 1 at that inflection point P3 is written into storage unit 6. An absolute value |T3−T2| of the difference between temperature T3 of power element unit 1 at inflection point P3 detected this time and temperature T2 of power element unit 1 at inflection point P2 detected last time is determined by operation unit 8. Three threshold values Tth1 to Tth3 are compared with |T3−T2| by count circuit 15. Tth2<|T3−T2|<Tth1 is satisfied, and it is determined that second temperature variation ΔT2 has occurred between times t2 and t3, and second count value C2 is incremented.

When the current consumed by the load decreases and temperature T of power element unit 1 reverses from increasing to decreasing at time t4, an inflection point P4 is detected, and a digital signal indicating a temperature T4 of power element unit 1 at that inflection point P4 is written into storage unit 7. An absolute value |T4−T3| of the difference between temperature T4 of power element unit 1 at inflection point P4 detected this time and temperature T3 of power element unit 1 at inflection point P3 detected last time is determined by operation unit 8. Three threshold values Tth1 to Tth3 are compared with |T4−T3| by count circuit 15. Tth3<|T4−T3|<Tth2 is satisfied, and it is determined that third temperature variation ΔT3 has occurred between times t3 and t4, and third count value C3 is incremented.

Similarly, an inflection point P5 is detected at time t5, and a digital signal indicating a temperature T5 of power element unit 1 at that inflection point P5 is written into storage unit 6. It is determined that third temperature variation ΔT3 has occurred between times t4 and t5, and third count value C3 is incremented.

An inflection point P6 is detected at time t6, and a digital signal indicating a temperature T6 of power element unit 1 at that inflection point P6 is written into storage unit 7. It is determined that third temperature variation ΔT3 has occurred between times t5 and t6, and third count value C3 is incremented.

Between times t6 and t7, the current supplied from power element unit 1 to the load is reduced from the rated value to 0 A. At time t7 when the operation of power element unit 1 is stopped and temperature T of power element unit 1 reaches room temperature, it is recognized that an inflection point P7 has occurred, and a temperature T7 of power element unit 1 at time t7 is written into storage unit 6.

An absolute value |T7−T6| of the difference between temperature T7 of power element unit 1 at inflection point P7 detected this time and temperature T6 of power element unit 1 at inflection point P6 detected last time is determined by operation unit 8. Three threshold values Tth1 to Tth3 are compared with |T7−T6| by count circuit 15. Tth3<|T7−T6| is satisfied, and it is determined that first temperature variation ΔT1 has occurred between times t6 and t7, and first count value C1 is incremented.

In the example shown in FIG. 3A, C1=2, C2=1, and C3=3 were obtained as shown in FIG. 3B. In FIG. 3B, since C1<Cth1, C2<Cth2, and C3<Cth3 are satisfied, alarm signal AL is maintained at the deactivated "L" level. When the operation of power element unit 1 is continued to satisfy C1≥Cth1, C2≥Cth2, or C3≥Cth3, then alarm signal AL is set to the activated "H" level to warn the user that power element unit 1 is about to reach the end of its life.

In this second embodiment, it is determined which one of the three types of temperature variations ΔT1 to ΔT3 has occurred depending on the magnitude of absolute value |ΔT| of the temperature difference between two inflection points, and one of threshold numbers of times Cth1 to Cth3 is selected depending on the type of the temperature variation, so that the life of power element unit 1 can be estimated more accurately than in the first embodiment.

It is noted that it may be determined which one of M types of temperature variations ΔT1 to ΔTM has occurred depending on the magnitude of absolute value |ΔT| of the temperature difference between two inflection points, and one of threshold numbers of times Cth1 to CthM may be selected depending on the type of the temperature variation. M in an integer greater than or equal to 2. Count circuit 15 compares |ΔT| with threshold temperatures Tth1 to TthM. Tthm>Tth(m+1) holds. M in an integer greater than or equal to 1 and less than or equal to (M−1). When |ΔT|>Tth1 is satisfied, it is determined that first temperature variation ΔT1 has occurred. When Tthm>|ΔT|>Tth(m+1) is satisfied, it is determined that $m^{th}$ temperature variation ΔTm has occurred. When the first to $M^{th}$ temperature variations have occurred, first to $M^{th}$ count values C1 to CM are incremented, respectively. Signal generation unit 16 compares count values C1 to CM with threshold numbers of times Cth1 to CthM, respectively. When at least one of conditions C1≥Cth1, C2≥Cth2, . . . , CM≥CthM is satisfied, alarm signal AL is set to the activated "H" level. The second embodiment has illustrated the case where M=3 is satisfied.

Third Embodiment

Figure 4:
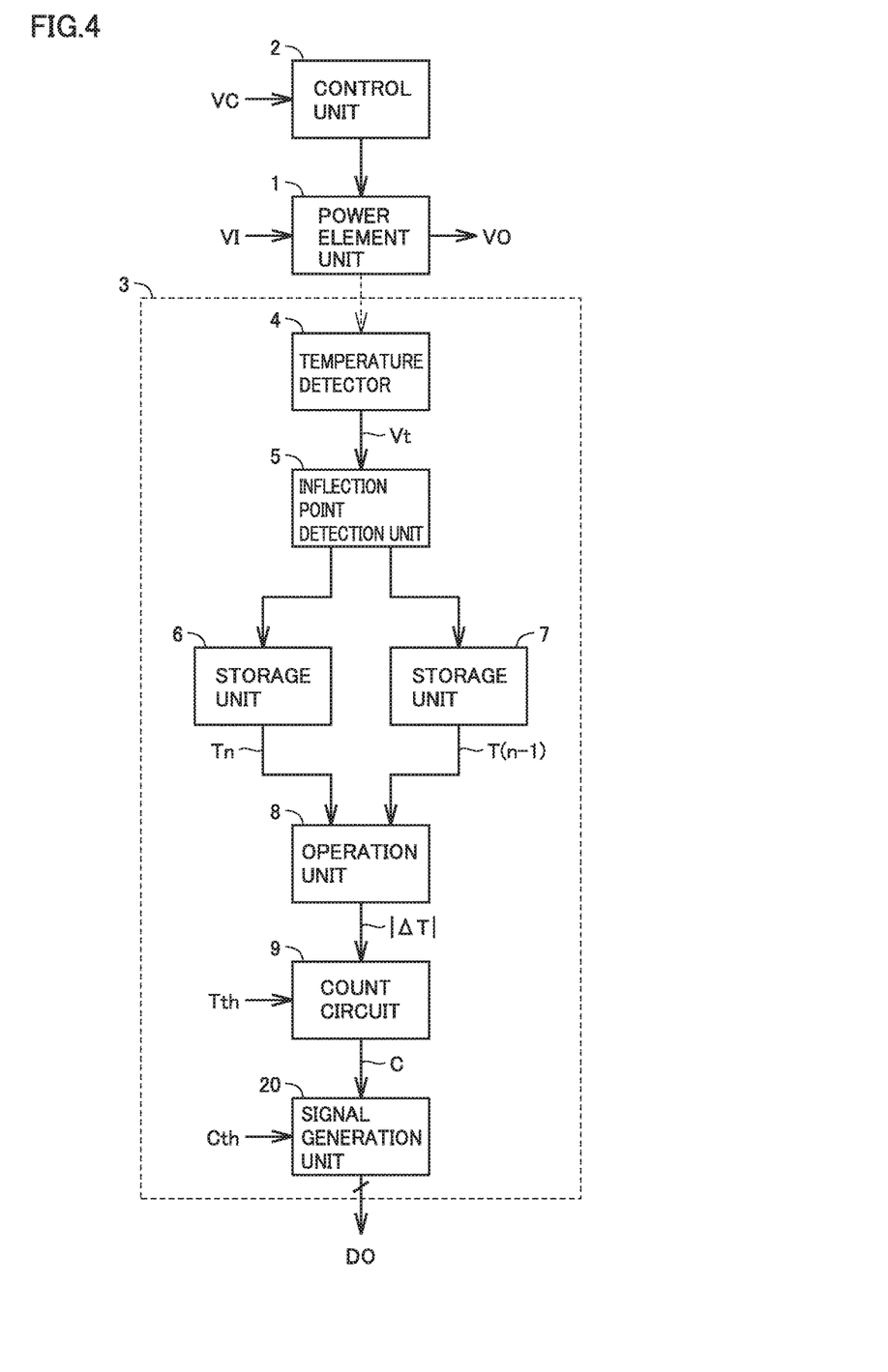
FIG. 4 is a block diagram showing the configuration of a power module according to a third embodiment of the present invention.

FIG. 4 is a block diagram showing the configuration of a power module according to a third embodiment, which is compared with FIG. 1. With reference to FIG. 4, this power module is different from the power module shown in FIG. 1 in that signal generation unit 10 has been replaced with a signal generation unit 20. Signal generation unit 20 outputs a digital signal DO indicating a difference Cth−C between threshold number of times Cth and count value C. Digital signal DO serves as a signal indicating an allowable number of times that a temperature variation occurs, that is, the remaining life of power element unit 1.

In this third embodiment, maintenance of the system, replacement of the power module and the like can be performed in a planned manner based on signal DO indicating the remaining life of power element unit 1.

Furthermore, since digital signal DO indicating the remaining life of power element unit 1 is output, the circuit size can be reduced, the number of components can be lowered, the cost can be reduced, and the defect rate can be lowered, as compared to the case where an analog signal indicating the remaining life of power element unit 1 is output.

Fourth Embodiment

Figure 5:
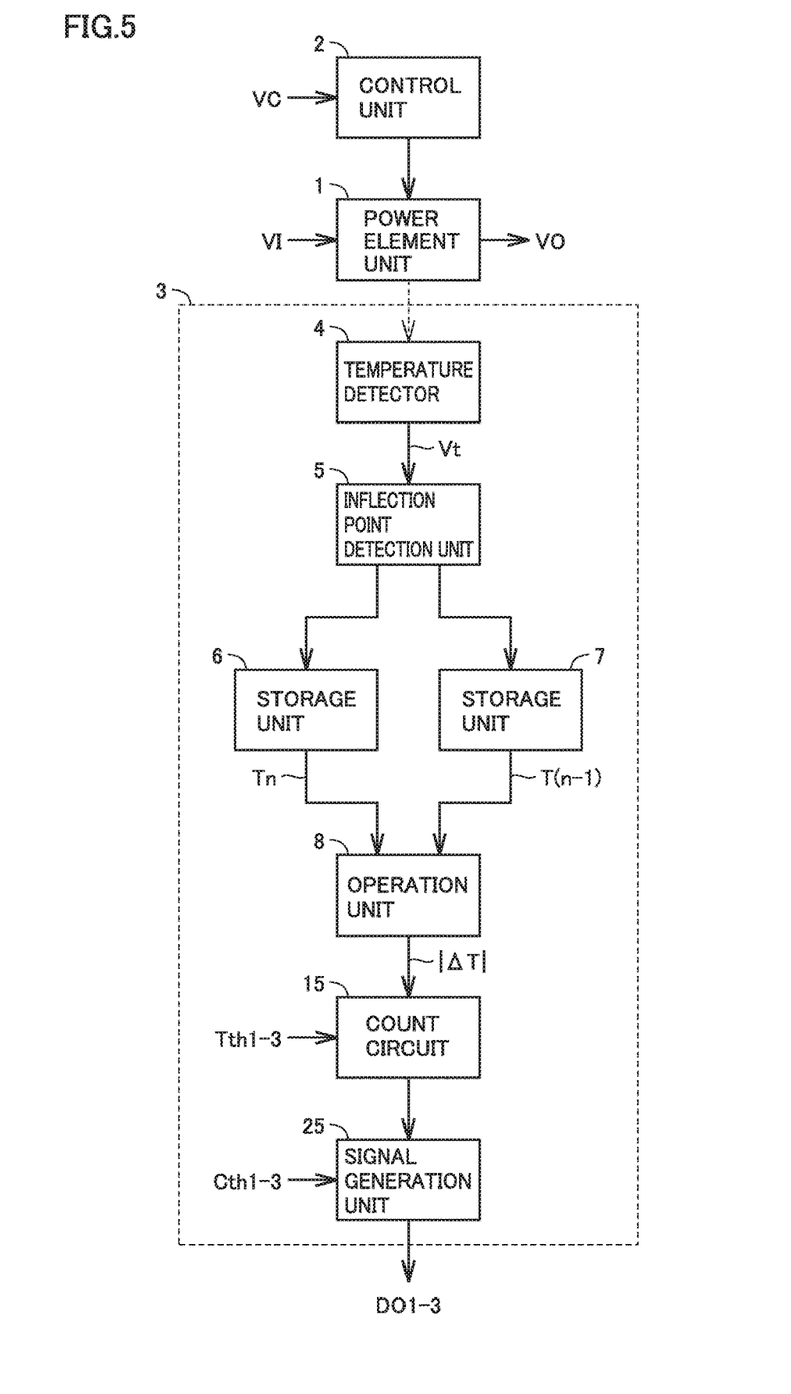
FIG. 5 is a block diagram showing the configuration of a power module according to a fourth embodiment of the present invention.

FIG. 5 is a block diagram showing the configuration of a power module according to a fourth embodiment, which is compared with FIG. 2. With reference to FIG. 5, this power module is different from the power module shown in FIG. 2 in that signal generation unit 16 has been replaced with a signal generation unit 25. Signal generation unit 25 outputs a digital signal DO1. indicating a difference Cth1−C1 between threshold number of times Cth1 and count value C1, a digital signal DO2 indicating a difference Cth2−C2 between threshold number of times Cth2 and count value C2, and a digital signal DO3 indicating a difference Cth3−C3 between threshold number of times Cth3 and count value C3.

Digital signal DO1 serves as a signal indicating an allowable number of times that first temperature variation ΔT1 occurs, that is, a first remaining life of power element unit 1. Digital signal DO2 serves as a signal indicating an allowable number of times that second temperature variation ΔT2 occurs, that is, a second remaining life of power element unit 1. Digital signal DO3 serves as a signal indicating an allowable number of times that third temperature variation ΔT3 occurs, that is, a third remaining life of power element unit 1.

In this fourth embodiment, the remaining life of power element unit 1 can be estimated more accurately than in the third embodiment.

It is noted that the number of times that first to $M^{th}$ temperature variations ΔT1 to ΔTM have occurred may be counted, and differences Cth1−C1, . . . , CthM−CM between threshold numbers of times Cth1 to CthM and count values C1 to CM may be output as digital signals DO1 to DOM. M in an integer greater than or equal to 2. The fourth embodiment has illustrated the case where M=3 is satisfied.

Fifth Embodiment

Figure 6:
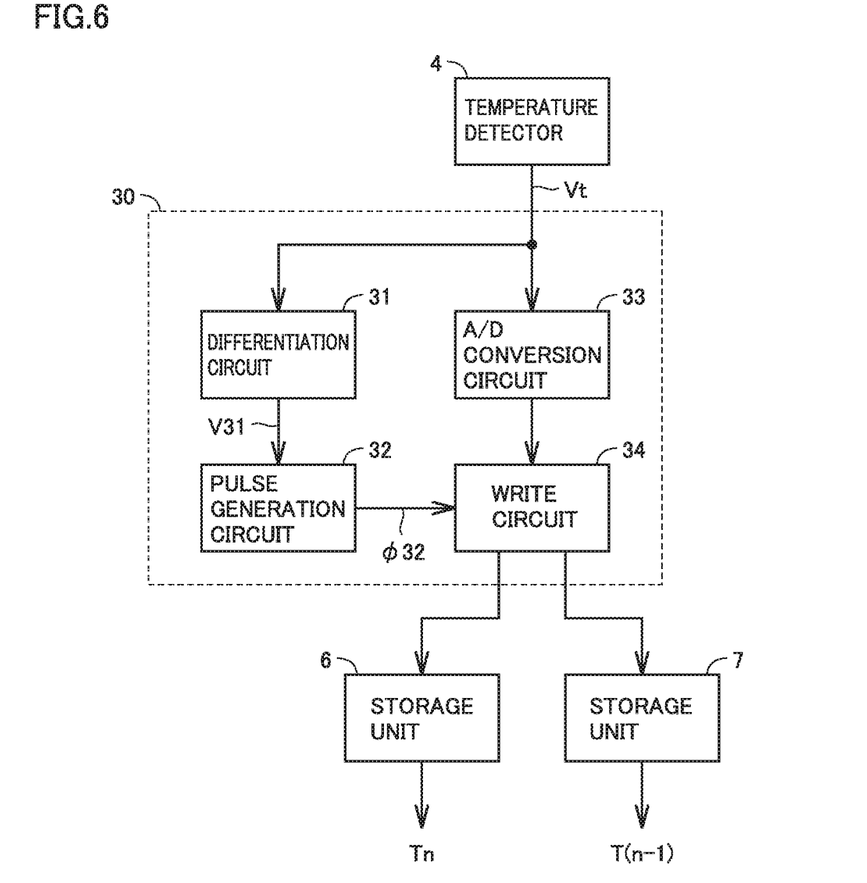
FIG. 6 is a block diagram showing a substantial part of a power module according to a fifth embodiment of the present invention.

FIG. 6 is a block diagram showing a substantial part of a power module according to a fifth embodiment of the present invention, which is compared with FIG. 1. With reference to FIG. 6, this power module is different from the power module shown in FIG. 1 in that inflection point detection unit 5 has been replaced with an inflection point detection unit 30. Inflection point detection unit 30 includes a differentiation circuit 31, a pulse generation circuit 32, an A/D conversion circuit 33, and a write circuit 34. Output signal Vt from temperature detector 4 is an analog voltage signal.

Differentiation circuit 31 is a CR filter circuit, for example, and differentiates output signal Vt from temperature detector 4. At an inflection point of signal Vt, an output signal V31 from differentiation circuit 31 reaches 0 V.

Whenever output signal V31 from differentiation circuit 31 reaches 0 V, pulse generation circuit 32 outputs a pulse signal φ32.

A/D conversion circuit 33 samples output signal Vt from temperature detector 4 at intervals sufficiently shorter than the interval during which the power elements included in power element unit 1 are turned on/off, and converts each sampled signal Vt into a digital signal and provides the digital signal to write circuit 34.

In response to pulse signal φ32 from pulse generation circuit 32, write circuit 34 writes the digital signals from A/D conversion circuit 33 alternately into storage units 6 and 7. For example, write circuit 34 writes the digital signal into storage unit 7 in response to odd-numbered pulse signal φ32, and writes the digital signal into storage unit 6 in response to even-numbered pulse signal φ32.

In this fifth embodiment, the circuit size can be reduced since the inflection point is detected using differentiation circuit 31.

Sixth Embodiment

Figure 7:
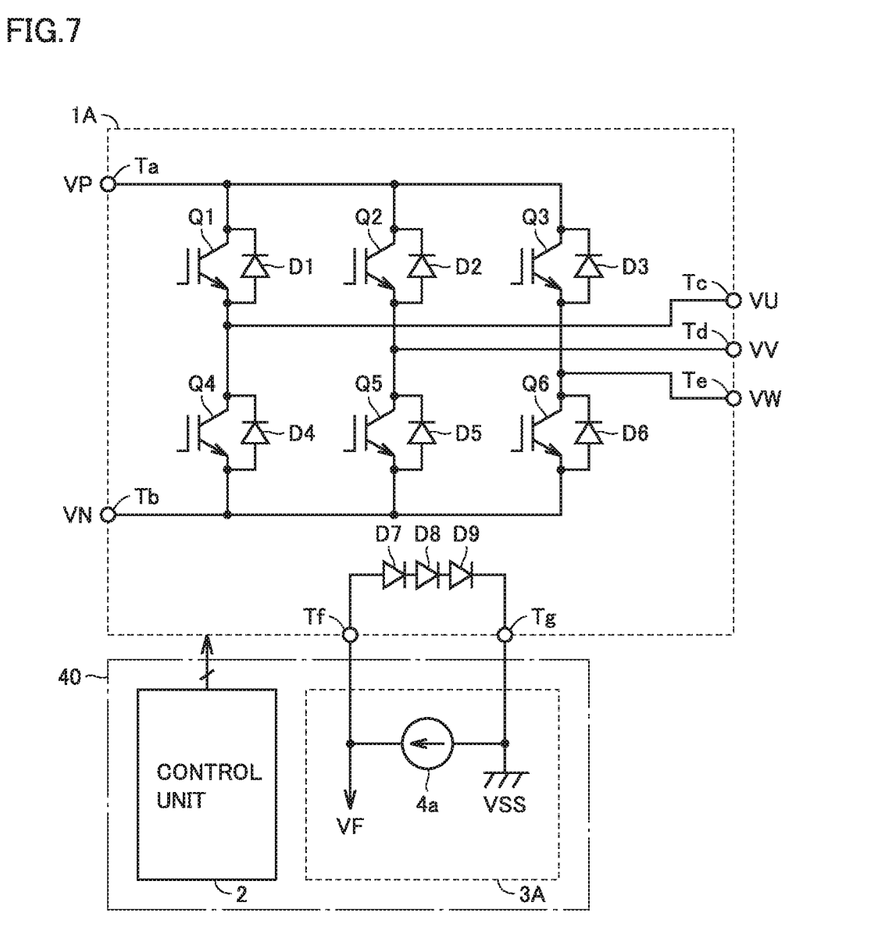
FIG. 7 is a circuit block diagram showing the configuration of a power module according to a sixth embodiment of the present invention.

FIG. 7 is a circuit block diagram showing the configuration of a power module according to a sixth embodiment of the present invention. In FIG. 7, this power module includes a power element unit 1A and a control IC 40.

Power element unit 1A includes DC input terminals Ta and Tb, AC output terminals Tc to Te, signal terminals Tf and Tg, transistors Q1 to Q6, and diodes D1 to D9. DC input terminals Ta and Tb receive DC voltages VP and VN from a DC power supply (not shown), respectively. DC voltage VP is higher than DC voltage VN. Three-phase AC voltages VU, VV and VW are output to AC output terminals Tc to Te, respectively.

Each of transistors Q1 to Q6 is an IGBT, for example. Transistors Q1 to Q3 have collectors each connected to DC input terminal Ta, and have emitters connected to AC output terminals Tc to Te, respectively. Transistors Q4 to Q6 have collectors connected to AC output terminals Tc to Te, respectively, and have emitters each connected to DC input terminal Tb. Diodes D1 to D6 are connected in anti-parallel with transistors Q1 to Q6, respectively. Each of transistors Q1 to Q6 is turned on/off by control unit 2.

Transistors Q1 to Q6 and diodes D1 to D6 form an inverter that converts DC power supplied from the DC power supply (not shown) through DC input terminals Ta and Tb into three-phase AC power, and outputs the AC power to a load through AC output terminals Tc to Te. Each of transistors Q1 to Q6 and diodes D1 to D6 is a power element.

Diodes D7 to D9 are connected in series in the forward direction between signal terminals Tf and Tg. Signal terminal Tf receives an output current from a constant current source 4a while signal terminal Tg receives a reference voltage VSS. A forward voltage VF of diodes D7 to D9 appears at signal terminal Tf. Forward voltage VF of diodes D7 to D9 varies depending on the temperature of diodes D7 to D9. Diodes D7 to D9 and constant current source 4a form a portion of temperature detector 4 shown in FIG. 1. Output signal Vt from temperature detector 4 is generated based on forward voltage VF of diodes D7 to D9.

That is, diodes D7 to D9 are mounted on a substrate (not shown) the same as where the inverter (namely, transistors Q1 to Q6 and diodes D1 to D6) is mounted. When a current is supplied from the inverter to the load, loss (namely, heat) occurs in each of transistors Q1 to Q6 and diodes D1 to D6, and the temperature of transistors Q1 to Q6 and diodes D1 to D6 varies depending on the current consumed by the load.

The heat generated in transistors Q1 to Q6 and diodes D1 to D6 is transferred to diodes D7 to D9, and the temperature of diodes D7 to D9 also varies depending on the temperature of transistors Q1 to Q6 and diodes D1 to D6. Forward voltage VF of diodes D7 to D9 varies depending on the temperature of diodes D7 to D9. A life estimation circuit 3A including constant current source 4a, and control unit 2 are mounted on the same control IC 40. The other configurations and operations are the same as those in the first embodiment, and thus will not be described repeatedly.

In this sixth embodiment, since diodes D7 to D9 for temperature detection are mounted on the substrate the same as where power elements Q1 to Q6 and D1 to D6 are mounted, the temperature of power elements Q1 to Q6 and D1 to D6 can be accurately detected. Furthermore, since life estimation circuit 3A and control unit 2 are mounted on single control IC 40, the circuit size can be reduced, the number of components can be lowered, the cost can be reduced, and the defect rate can be lowered.

It is noted that each of transistors Q1 to Q6 may be a semiconductor switching element other than an IGBT. For example, it may be a bipolar transistor or a MOSFET.

Various modifications of this sixth embodiment are described below. In the first modification, transistors Q1 to Q6 are formed of silicon (Si) while diodes D1 to D6 are formed of silicon carbide (SiC). A semiconductor element formed of silicon carbide has a high breakdown voltage and a high allowable current density. Accordingly, diodes D1 to D6 can be reduced in size, so that the power module can be reduced in size.

In the second modification, all of transistors Q1 to Q6 and diodes D1 to D6 are formed of silicon carbide. Accordingly, transistors Q1 to Q6 and diodes D1 to D6 can be reduced in size, so that the power module can be further reduced in size than in the first modification.

In the third modification, the six pairs of transistors Q and diodes D shown in FIG. 7 are replaced with six reverse-conducting IGBTs, where each reverse-conducting IGBT is formed of silicon carbide. The reverse-conducting IGBT is a semiconductor element including an IGBT and a diode connected in anti-parallel with the IGBT. Accordingly, the power module can be further reduced in size than in the second modification, so that the assembly operation can be further simplified.

Although the embodiments the present invention have been described, it should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A life estimation circuit for estimating life of a power element, the life estimation circuit comprising:
   a temperature detector configured to detect temperature of the power element;
   an inflection point detection unit configured to detect an inflection point of temperature variation in the power element based on a result of the detection by the temperature detector;
   an operation unit configured to determine an absolute value of a difference between the temperature of the power element at an inflection point detected this time by the inflection point detection unit and the temperature of the power element at an inflection point detected last time by the inflection point detection unit;

a count circuit configured to count the number of times of occurrence of a first temperature variation in which the absolute value of the difference in temperature determined by the operation unit reaches a first threshold temperature; and a signal generation unit configured to output a signal related to the life of the power element based on a count value from the count circuit, where in the inflection point detection unit includes a differentiation circuit, a pulse generation circuit, an A/D conversion circuit, and a write circuit.

2. The life estimation circuit according to claim 1, wherein in response to the number of times of the occurrence of the first temperature variation reaching a first threshold number of times, the signal generation unit outputs a signal indicating that the power element is about to reach the end of its life as the signal related to the life of the power element.

3. The life estimation circuit according to claim 2, wherein the count circuit further counts the number of times of occurrence of a second temperature variation in which the absolute value of the difference in temperature determined by the operation unit reaches a second threshold temperature lower than the first threshold temperature, and in response to the number of times of the occurrence of the second temperature variation reaching a second threshold number of times higher than the first threshold number of times, the signal generation unit further outputs, the signal indicating that the power element is about to reach the end of its life.

4. The life estimation circuit according to claim 1, wherein the signal generation unit determines a first remaining life of the power element based on a difference between a first threshold number of times and the number of times of the occurrence of the first temperature variation, and outputs a signal indicating the first remaining life of the power element as the signal related to the life of the power element.

5. The life estimation circuit according to claim 4, wherein the count circuit further counts the number of times of occurrence of a second temperature variation in which the absolute value of the difference in temperature determined by the operation unit reaches a second threshold temperature lower than the first threshold temperature, and the signal generation unit further determines a second remaining life of the power element based on a difference between a second threshold number of times higher than the first threshold number of times and the number of times of the occurrence of the second temperature variation, and outputs a signal indicating the second remaining life of the power element.

6. The life estimation circuit according to claim 1, wherein the signal related to the life of the power element is a digital signal.

7. The life estimation circuit according to claim 1, wherein the temperature detector outputs a signal indicating the temperature of the power element, and the inflection point detection unit includes a differentiation circuit configured to differentiate the signal output from the temperature detector.

8. The life estimation circuit according to claim 1, wherein the temperature detector includes a diode whose forward voltage varies depending on the temperature of the power element.

9. The life estimation circuit according to claim 8, wherein the diode is mounted on a substrate where the power element is mounted.

10. A semiconductor device comprising:

the life estimation circuit according to claim 1;

the power element; and a control unit configured to control the power element.

11. The semiconductor device according to claim 10, wherein at least a portion of the life estimation circuit is mounted on a control IC where the control unit is mounted.

12. The semiconductor device according to claim 10, wherein the power element includes a transistor made of Si, and a diode made of SiC.

13. The semiconductor device according to claim 10, wherein the power element includes a transistor made of SiC, and a diode made of SiC.

14. The semiconductor device according to claim 10, wherein the power element includes a reverse-conducting IGBT formed of SiC, and the reverse-conducting IGBT includes an IGBT and a diode connected in anti-parallel with the IGBT.

15. The life estimation circuit according to claim 1, wherein the inflection point of the temperature variation is a point at which the temperature of the power element reverses from increasing to decreasing, or reverses from decreasing to increasing.

16. The life estimation circuit according to claim 1, wherein the signal related to the life of the power element is a signal indicating that the power element is about to reach the end of its life.

* * * * *